(12) United States Patent
Murty

(10) Patent No.: US 9,048,629 B2
(45) Date of Patent: *Jun. 2, 2015

(54) SEMICONDUCTOR DEVICE HAVING A VERTICAL CAVITY SURFACE EMITTING LASER (VCSEL) AND A PROTECTION DIODE INTEGRATED THEREIN AND HAVING REDUCED CAPACITANCE TO ALLOW THE VCSEL TO ACHIEVE HIGH OPERATING SPEEDS

(71) Applicant: Avago Technologies General IP (Singapore) Pte. Ltd., Singapore (SG)

(72) Inventor: Ramana Murty, Sunnyvale, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/925,324

(22) Filed: Jun. 24, 2013

(65) Prior Publication Data

US 2013/0279531 A1    Oct. 24, 2013

Related U.S. Application Data

(63) Continuation of application No. 13/194,964, filed on Jul. 31, 2011, now Pat. No. 8,488,645.

(51) Int. Cl.
| | |
|---|---|
| H01S 5/00 | (2006.01) |
| H01S 5/183 | (2006.01) |
| H01L 25/16 | (2006.01) |
| H01S 5/026 | (2006.01) |
| H01S 5/068 | (2006.01) |
| H01S 5/042 | (2006.01) |

(52) U.S. Cl.
CPC .............. *H01S 5/183* (2013.01); *H01L 25/167* (2013.01); *H01S 5/0261* (2013.01); *H01S 5/0425* (2013.01); *H01S 5/06825* (2013.01); *H01S 5/18308* (2013.01)

(58) Field of Classification Search
CPC ....... H01S 5/00; H01S 5/0206; H01S 5/0208; H01S 5/06256; H01S 5/18; H01S 5/183; H01S 5/18322; H01S 5/1833; H01S 5/18333; H01S 5/187
USPC ................................ 372/43.01, 50.11, 50.124
See application file for complete search history.

(56) References Cited

U.S. PATENT DOCUMENTS

| | | | |
|---|---|---|---|
| 6,185,240 B1 | 2/2001 | Jiang et al. | |
| 7,508,047 B2 | 3/2009 | Tatum et al. | |
| 7,693,201 B2 | 4/2010 | Albrecht et al. | |
| 7,924,899 B2 | 4/2011 | Kondo | |
| 8,488,645 B2 * | 7/2013 | Murty | 372/50.11 |
| 2007/0188951 A1 | 8/2007 | Crews | |
| 2007/0246716 A1 | 10/2007 | Bhat et al. | |
| 2007/0272939 A1 | 11/2007 | Peng | |

* cited by examiner

*Primary Examiner* — Dung Nguyen

(57) ABSTRACT

A semiconductor device is provided that has a VCSEL and a protection diode integrated therein and that has an additional intrinsic layer. The inclusion of the additional intrinsic layer increases the width of the depletion region of the protection diode, which reduces the amount of capacitance that is introduced by the protection diode. Reducing the amount of capacitance that is introduced by the protection diode allows the VCSEL to operate at higher speeds.

22 Claims, 3 Drawing Sheets

SEMICONDUCTOR DEVICE HAVING A VERTICAL CAVITY SURFACE EMITTING LASER (VCSEL) AND A PROTECTION DIODE INTEGRATED THEREIN AND HAVING REDUCED CAPACITANCE TO ALLOW THE VCSEL TO ACHIEVE HIGH OPERATING SPEEDS

CROSS-REFERENCE TO RELATED APPLICATIONS

This application is a continuation application of application Ser. No. 13/194,964, filed on Jul. 31, 2011, entitled "A SEMICONDUCTOR DEVICE HAVING A VERTICAL CAVITY SURFACE EMITTING LASER (VCSEL) AND A PROTECTION DIODE INTEGRATED THEREIN AND HAVING REDUCED CAPACITANCE TO ALLOW THE VCSEL TO ACHIEVE HIGH OPERATING SPEEDS," which has been allowed and which is hereby incorporated by reference herein in its entirety.

TECHNICAL FIELD OF THE INVENTION

The invention relates to vertical cavity surface emitting lasers (VCSELs). More particularly, the invention relates to a semiconductor device having a VCSEL and a protection diode integrated therein and having reduced capacitance to allow the VCSEL to achieve high operating speeds.

BACKGROUND OF THE INVENTION

VCSELs are widely used as light sources for optical interconnect devices, storage area networks, and sensors. In order to enable VCSELs to operate at increasingly higher speeds, or data rates, the aperture sizes must be made increasingly smaller. Decreasing the size of the aperture, however, makes the VCSEL increasingly susceptible to electrostatic discharge (ESD) damage. The ESD damage threshold for VCSELs is commonly characterized by models such as the human body model (HBM) and the machine model (MM). For a VCSEL aperture diameter in the range of 5-10 micrometers (microns), the HBM damage threshold voltage is typically in the range of 100 to 200 volts (V) and the MM damage threshold voltage is typically under 50 V. VCSELs have a p-intrinsic-n (PIN) structure and the damage threshold for ESD is asymmetric, i.e., an ESD pulse traveling in the reverse-bias direction is more damaging than an ESD pulse traveling in the forward-bias direction.

It is known to integrate a protection diode with a laser diode in a semiconductor device. For example, U.S. Pat. Nos. 6,185,240, 7,508047 and 7,693,201 disclose semiconductor devices in which a laser diode and a protection diode are integrated together in the semiconductor device. One of the problems associated with integrating the protection diode together with the laser diode in the same semiconductor device is that the inclusion of the protection diode introduces capacitance, which decreases the operating speed of the laser diode. The capacitance $C_d$ of the protection diode can be expressed as:

$$C_d = \in A/d, \quad \text{(Equation 1)}$$

where $\in$ is the permittivity of the semiconductor material, A is the area of protection diode, and d is the width of depletion region of the protection diode. Decreasing the area, A, or increasing the width, d, of the depletion region will decrease the capacitance, $C_d$, of the protection diode. Decreasing area A to reduce $C_d$ is not desirable because a small area A leads to a high thermal resistance and high current density. The high thermal resistance will lead to rapid temperature rise during an ESD event and result in a low damage threshold. On the other hand, increasing the area, A, of the protection diode increases the damage threshold voltage of the laser diode, but also increases the amount of capacitance that is introduced by the protection diode, which limits the operating speed, or the data rate, of the laser diode.

The most common configuration of a VCSEL is a conducting n-type substrate with an n-type distributed Brag reflector (DBR), an active region (intrinsic layer), and a p-type DBR sequentially grown on it. Although the design described in U.S. Pat. No. 6,185,240 can be configured such that $C_d$ is relatively small, the design cannot be used in the common VCSEL configuration described above because the cathode (n-side) of the VCSEL and diode are always connected through the substrate. Consequently, the substrate cannot be a conducting substrate.

Accordingly, a need exists for a semiconductor device having a VCSEL and a protection diode integrated together therein in a configuration that has reduced capacitance to enable the VCSEL to operate at higher speeds. A need also exists for such a configuration that is applicable to VCSELs fabricated on both conducting and semi-insulating substrates.

SUMMARY OF THE INVENTION

The invention is directed to a semiconductor device having a VCSEL and a protection diode for ESD protection integrated therein and having reduced capacitance to enable the VCSEL to operate at higher speeds. In accordance with an embodiment, the semiconductor device comprises a substrate having at least one layer of n-type semiconductor material disposed on an upper surface thereof, a first plurality of layers comprising a semiconductor material formed on top of the n-type layer, a first intrinsic layer containing a light-emitting material disposed on top of the first plurality of layers, a second plurality of layers comprising a semiconductor material disposed on top of the first intrinsic layer, a second intrinsic layer disposed on top of the second plurality of layers, at least one layer of n-type semiconductor material disposed on top of the second intrinsic layer, p and n contact pads, first and second metal interconnects, and one or more layers of dielectric material. A first, lower distributed Bragg reflector (DBR) is formed in the first plurality of layers. At least one of the first plurality of layers is of an n-type. A second, upper DBR is formed in the second plurality of layers. At least one of the second plurality of layers is of a p-type. Portions of the first plurality of layers, the first intrinsic layer, and the second plurality of layers constitute a VCSEL. Portions of the second plurality of layers, the second intrinsic layer, and the layer of n-type semiconductor material constitute a protection diode for protecting the VCSEL from ESD events.

In accordance with another embodiment, the semiconductor device comprises a substrate having at least one layer of p-type semiconductor material disposed on an upper surface thereof, a first plurality of layers comprising a semiconductor material formed on top of the layer of p-type semiconductor material, a first intrinsic layer containing a light-emitting material disposed on top of the first plurality of layers, a second plurality of layers comprising a semiconductor material disposed on top of the first intrinsic layer, a second intrinsic layer disposed on top of the second plurality of layers, at least one layer of p-type semiconductor material disposed on top of the second intrinsic layer, p and n contact pads, first and second metal interconnects, and one or more layers of dielectric material. A first, lower DBR is formed in the first plurality of layers, at least one of which is of a p-type. A second, upper DBR is formed in the second plurality of layers, at least one of which is of n-type. Portions of the first plurality of layers, the first intrinsic layer, and the second plurality of layers constitute a VCSEL. Portions of the second plurality of layers, the second intrinsic layer, and the layer of p-type semiconductor material constitute a protection diode for protecting the VCSEL from ESD events.

The invention is also directed to a method for providing ESD protection in a semiconductor device. The method comprises various steps for forming a VCSEL and a protection diode in a semiconductor device.

These and other features and advantages of the invention will become apparent from the following description, drawings and claims.

DETAILED DESCRIPTION OF AN EXEMPLARY EMBODIMENT

Figure 1:
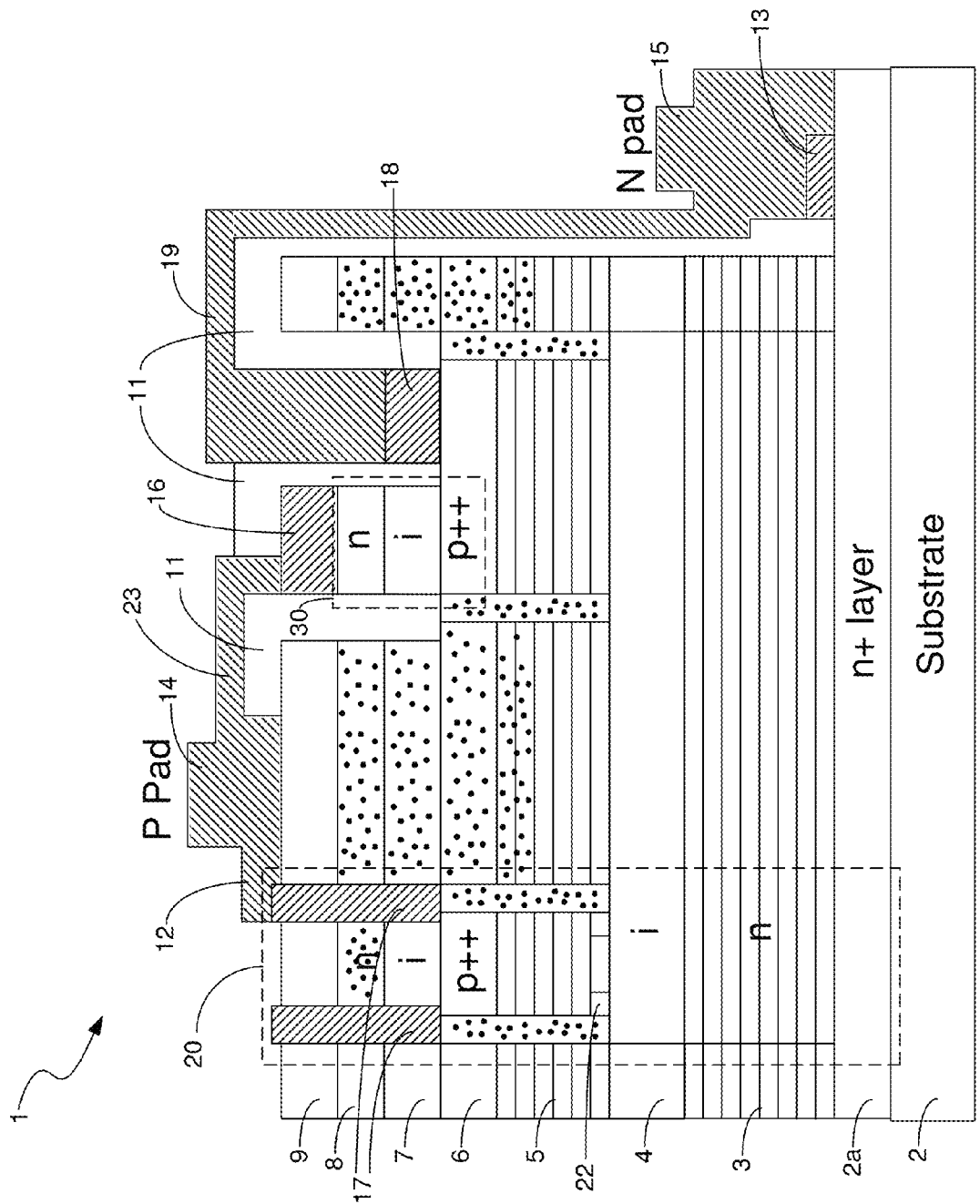
FIG. 1 illustrates a cross-sectional view of the semiconductor device in accordance with an illustrative, or exemplary, embodiment.

The invention is directed to a semiconductor device having a VCSEL and a protection diode integrated therein. An additional intrinsic (i) layer is included in the semiconductor device. The inclusion of the additional i layer allows the width, d, of the depletion region of the protection diode to be increased, which reduces the amount of capacitance, $C_d$, that is introduced by the protection diode. Reducing $C_d$ allows the VCSEL to operate at higher speeds. An illustrative, or exemplary, embodiment will now be described with reference to FIGS. 1-3, in which like reference numerals represent like features, elements or components.

Figure 3:
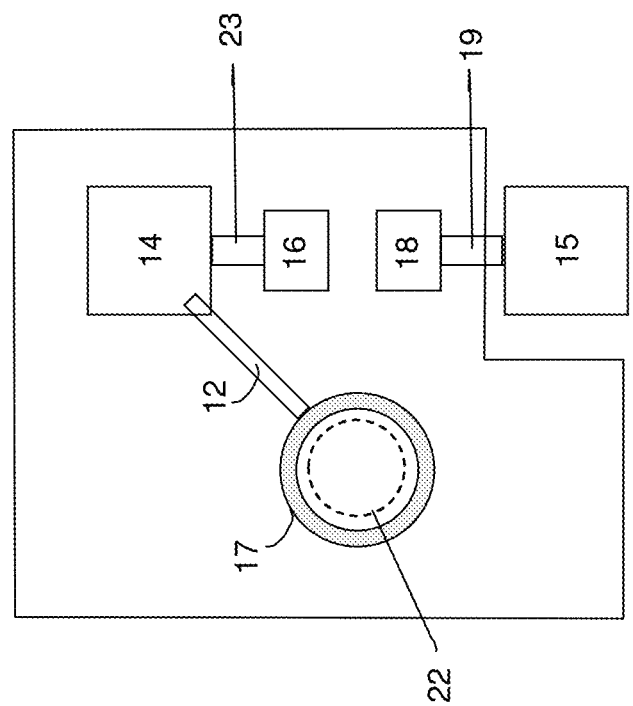
FIG. 3 illustrates a top plan view of a portion of the semiconductor device shown in FIG. 1.

FIG. 1 illustrates a cross-sectional view of the semiconductor device 1 in accordance with an illustrative, or exemplary, embodiment. FIG. 3 illustrates a top plan view of a portion of the semiconductor device 1 shown in FIG. 1. The semiconductor device 1 has an n+ substrate 2 having a n+ layer 2a disposed thereon, a lower n-type distributed Bragg reflector (DBR) 3 disposed on top of layer 2, a first intrinsic (i) region 4 disposed on top of the lower n-type DBR 3, an upper p-type DBR 5 disposed on top of the first i region 4, a p++ layer 6 disposed on top of the upper p-type DBR 5, a second i region 7 disposed on top of p++ layer 6, an n layer 8 disposed on top of the second i region 7, a first dielectric layer 9 disposed on top of portions of layer 8, a second dielectric layer 11 disposed on top of portions of the first dielectric layer 9, a p contact pad 14, and an n contact pad 15.

The VCSEL is made up of the layers that are contained within the dashed block 20, which will be referred to hereinafter as the VCSEL 20. The protection diode is made up of the layers that are contained within the dashed block 30, which will be referred to hereinafter as the protection diode 30. The VCSEL 20 has a typical p-i-n VCSEL structure in that it has an i layer sandwiched between a lower DBR and an upper DBR, with one or more additional n-type layers disposed on one side of the i layer and one or more additional p-type layers disposed on the other side of the i layer. The first i region 4 contains one or more layers of the light emitting material. The substrate 2 may be a conducting (n-type) substrate or semi-insulating semiconductor substrate. A current confinement structure in the VCSEL 20, represented by reference numeral 22, may be achieved by a variety of methods, including, for example, lateral oxidation of an aluminum gallium Arsenide (AlGaAs) layer with a high aluminum (Al) fraction, ion implantation, or etching.

The black dots shown in portions of the layers 5-8 represent ions that have been implanted in those layers to render the implanted portions highly resistive. These highly resistive portions ensure that the p++ side (i.e., upper p-type DBR 5 and p++ layer 6) of the protection diode 30 is electrically isolated from the p++ side (i.e., upper p-type DBR 5 and p++ layer 6) of the VCSEL 20. An ohmic contact 13 is made to the n side (i.e., n+ layer 2 and lower n-type DBR 3) of the VCSEL 20. An ohmic contact 16 is made to the n side (i.e., n layer 8) of the protection diode 30. Likewise, ohmic contacts 17 and 18 are made to the p++ layer 6 of VCSEL 20 and protection diode 30, respectively. The n side of the VCSEL 20 is connected to the p++ side of the protection diode 30 by a metal interconnect 19. The p++ side of the VCSEL 20 is connected through interconnect 12 to the p contact pad 14. The ohmic contact 13 is connected to the n contact pad 15. A metal interconnect 23 connects the p contact pad 14 with the ohmic contact 16.

The protection diode 30 provides a low impedance path for ESD pulses traveling in the reverse-bias direction of the VCSEL 20, while ESD pulses traveling in the forward-bias direction of the VCSEL 20 pass mainly through the VCSEL 20. Thus, the protection diode 30 protects the VCSEL 20 from ESD events that can cause the greatest damage to the VCSEL 20, namely, ESD pulses traveling in the reverse-bias direction. The inclusion of the additional i layer 7 allows the width, d, of the depletion region of the protection diode 30 to be increased, which reduces the amount of capacitance, $C_d$, introduced by the protection diode. Reducing $C_d$, in turn, allows the VCSEL 20 to operate at higher speeds. Layers 7 and 8 may modify the reflectance of the upper p-type DBR 5 of the VCSEL 20, and are taken into account in the VCSEL design.

Figure 2:
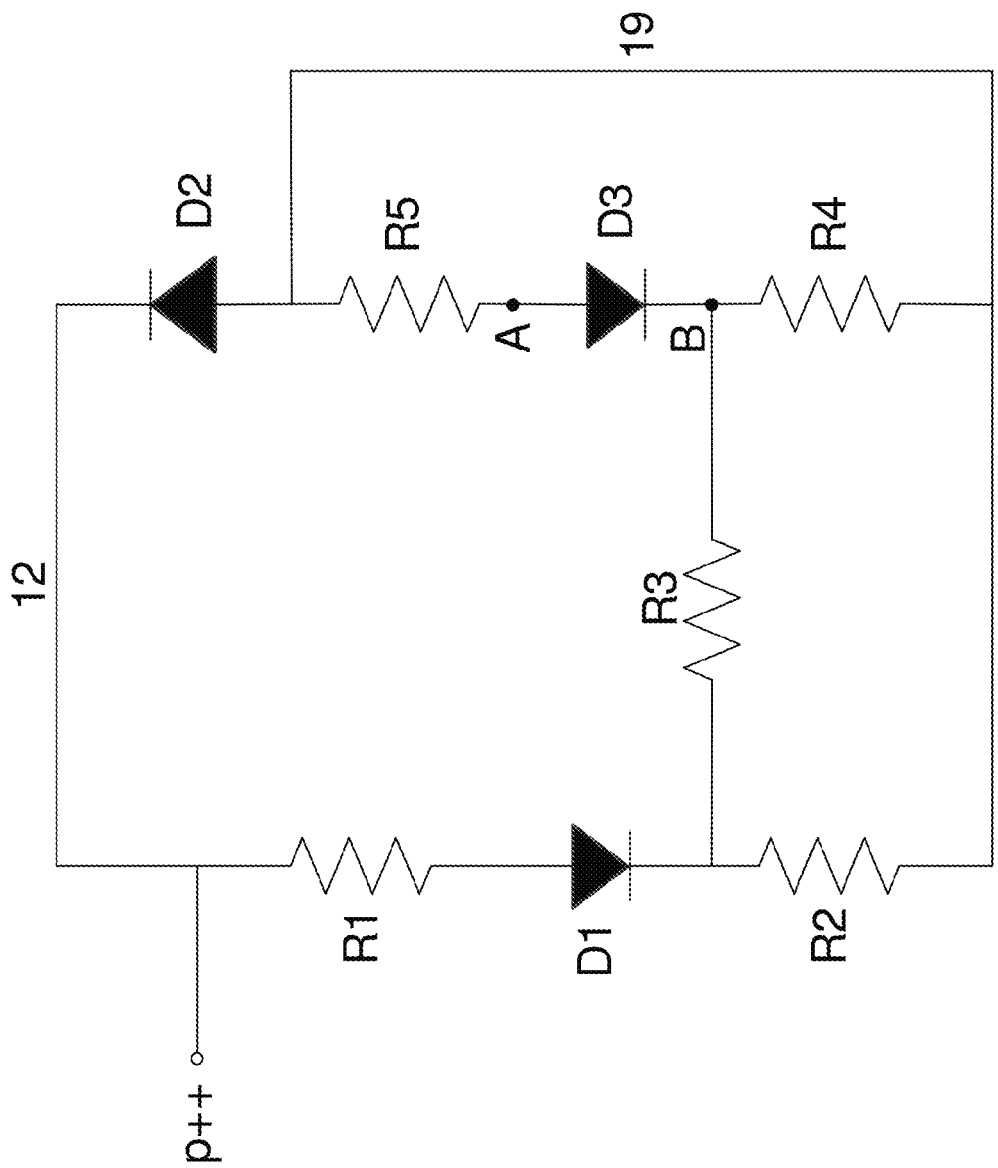
FIG. 2 illustrates an equivalent circuit diagram of the semiconductor device shown in FIG. 1.

FIG. 2 illustrates an equivalent circuit diagram for the semiconductor device 1 shown in FIG. 1. Diode D1 corresponds to the VCSEL 20. Diode D2 corresponds to the protection diode 30. A distributed resistor network made up of resistors R2, R3 and R4 represents the lower DBR 3. Resistors R1 and R5 represent the upper DBR 5. Diode D3 is an unintended parasitic diode corresponding to the p-i-n layers making up the upper DBR 5, the i layer 4 and the lower DBR 3, respectively. Diode D3 is largely inactive due to the fact that nodes A and B are at approximately the same potential.

For operation of the VCSEL 20 at high data rates, the parasitic capacitance arising from the additional semiconductor junctions in layers 6, 7 and 8 comprising the protection diode 30, as well as the parasitic capacitance arising from the interconnects 12 and 19, should be kept small. The thickness of the additional i layer 7 relates to the width, d, of the depletion region of the protection diode 30. This thickness and the area of the protection diode 30 are selected to ensure that the capacitance, $C_d$, of the protection diode 30 is small. The metal interconnects 12 and 19 between the protection diode 30 and the VCSEL 20 are laid over the dielectric layers 9 and/or 11, and also over most of the implanted region. Consequently, the metal interconnects 12 and 19 can be several microns wide and still contribute only a small amount of capacitance and inductance. As indicated above, the portion of the n layer 8 that is disposed over the current confinement structure 22 of the VCSEL 20 is rendered resistive by ion implantation, which helps reduce the capacitance of the p-i-n structure disposed above the VCSEL 20. The background doping in the intrinsic layer 7 should typically be below 3E16 cm$^{-3}$ to achieve a large depletion region width, d. For many applications, the depletion region width, d, will typically be equal to or greater than 400 nanometers (nm), but may be as small as 100 nm in some applications.

It should be noted that one may choose not to implant the section of layer 8 that is in the region of VCSEL 20. The section of layer 8 that is in the region of VCSEL 20 could also be electrically connected (not shown) to the p contact pad 14.

The invention is not limited with respect to the chemical elements or compounds that are used for the various layers of the semiconductor device 1. Known semiconductor processes may be used to fabricate the semiconductor device 1, and a variety of materials may be used to make the semiconductor device 1. An example of materials that may be used to make the semiconductor device 1 is as follows: the substrate 2 is made of n-doped gallium arsenide (GaAs); the lower DBR 3 is made up of several layers of n-doped aluminum gallium arsenide (AlGaAs) having different percentages of Al or Ga to make them alternate between high and low refractive indices; the first i region 4, which corresponds to the active region of the VCSEL 20, contains GaAs quantum wells that are un-doped or have a very low doping; the upper DBR 5 is made up of several layers of p-doped AlGaAs having different percentages of Al or Ga to make them alternate between high and low refractive indices; the p++ layer 6 is made up of highly p-doped AlGaAs; the additional i region 7 is made up of AlGaAs that is un-doped or that has a very low doping; the layer 8 is made up of n-doped GaAs; the layer 9 is made of a dielectric material such as silicon nitride (SiN); and the layer 11 is made of a dielectric material such as silicon oxynitride (SiON).

While the semiconductor device 1 has been described as being made primarily of GaAs related materials, other compounds may be used for the semiconductor device 1. The compounds that are used for the semiconductor device 1 are selected to have desired bandgap energies that enable desired light emission wavelengths to be produced. Examples of other suitable materials that may be used for the semiconductor device 1 include, but are not limited to, aluminum gallium arsenide (AlGaAs), gallium phosphide (GaP), indium gallium phosphide (InGaP), gallium nitride (GaN), indium gallium arsenide (InGaAs), indium gallium arsenide nitride (InGaNAs), indium phosphide (InP), and gallium indium phosphide (GaInP). It should also be noted that layers that are designated in FIG. 1 as being of n-type may instead be of p-type, and vice versa. For example, if the substrate 2, layer 2a and the lower DBR 3 are made of p-type material, the upper DBR 5 and layer 6 will be made of n-type material and the layer 8 will be made of p-type material.

It should also be noted that the invention is not limited with respect to the manner in which the VCSEL modulation signal is applied to the VCSEL 20. For example, the modulation signal may be applied to the VCSEL 20 on the p side (i.e., anode drive), on the n side (i.e., cathode drive), or differentially (i.e., a differential signal applied across the p and n sides of the VCSEL 20.

It should be noted that the invention has been described with reference to illustrative embodiments and that the invention is not limited to these embodiments. Those skilled in the art will understand the manner in which modifications can be made to the illustrative embodiments and that all such modifications are within the scope of the invention. For example, while FIG. 1 shows a particular combination of layers, the semiconductor device 1 may include more layers or fewer layers than what is shown in FIG. 1. Also, the locations of the layers may be different from that which is shown in FIG. 1. For example, the lower and upper DBRs 3 and 5, respectively, may be disposed at locations that are different from that which is shown in FIG. 1. These and other modifications may be made to the embodiments described herein and all such modified embodiments are also within the scope of the invention, as will be understood by persons skilled in the art.

What is claimed is:

1. A semiconductor device comprising:
   a substrate;
   a first plurality of layers comprising a semiconductor material disposed on top of the substrate, wherein a first, lower distributed Bragg reflector (DBR) is formed in the first plurality of layers, and wherein at least one of the first plurality of layers is of the first type of semiconductor material;
   at least a first intrinsic layer containing a light-emitting material disposed on top of the lower DBR, said at least a first intrinsic layer being an active region of the semiconductor device;
   a second plurality of layers comprising a semiconductor material disposed on top of said at least a first intrinsic layer, wherein a second, upper DBR is formed in the second plurality of layers, and wherein at least one of the second plurality of layers is of a second type of semiconductor material that is different from the first type, and wherein portions of the first plurality of layers, said at least a first intrinsic layer, and the second plurality of layers constitute a vertical cavity surface emitting laser (VCSEL);
   at least a second intrinsic layer disposed on top of the upper DBR; and
   at least one layer of said first type of semiconductor material disposed on top of said at least a second intrinsic layer, and wherein portions of the upper DBR, said at least a second intrinsic layer, and said at least one layer of said first type of semiconductor material constitute a protection diode for protecting the VCSEL from electrostatic discharge (ESD) events.

2. The semiconductor device of claim 1, wherein said portion of said at least a second intrinsic layer has a depletion region that has a width that is equal to or greater than 100 nanometers (nm).

3. The semiconductor device of claim 2, wherein said portion of said at least a second intrinsic layer has a depletion region that has a width that is equal to or greater than 400 nanometers (nm).

4. The semiconductor device of claim 1, further comprising:
   ohmic p and n contact pads in contact with the VCSEL and protection diode;
   a first metal interconnect connecting the p contact pad that is in contact with the VCSEL with the n contact pad that is in contact with the protection diode;
   a second metal interconnect connecting the n contact pad that is in contact with the VCSEL with the p contact pad that is in contact with the protection diode; and
   one or more layers of dielectric material disposed on the semiconductor device and electrically isolating the p and n contact pads from each other, and wherein said at least a second intrinsic layer reduces a capacitance of the protection diode to allow the VCSEL to operate at high speeds.

5. The semiconductor device of claim 1, wherein the first type of semiconductor material is n-type semiconductor material, and wherein all of the layers of the first plurality of layers are made of n-type semiconductor material.

6. The semiconductor device of claim 5, wherein the second type of semiconductor material is p-type semiconductor material, and wherein all of the layers of the second plurality of layers are made of p-type semiconductor material.

7. The semiconductor device of claim 6, wherein at least one of the layers of the second plurality of layers is of type p++.

8. The semiconductor device of claim 1, wherein the substrate comprises a conducting material.

9. The semiconductor device of claim 1, wherein the substrate comprises a semi-insulating material.

10. The semiconductor device of claim 1, wherein the first type of semiconductor material is p-type semiconductor material, and wherein all of the layers of the first plurality of layers are made of p-type semiconductor material.

11. The semiconductor device of claim 10, wherein the second type of semiconductor material is n-type semiconductor material, and wherein all of the layers of the second plurality of layers are made of n-type semiconductor material.

12. The semiconductor device of claim 11, wherein at least one of the layers of the second plurality of layers is of type n++.

13. The semiconductor device of claim 10, wherein the substrate comprises a conducting material.

14. The semiconductor device of claim 10, wherein the substrate comprises a semi-insulating material.

15. A method for providing electrostatic discharge (ESD) protection in a semiconductor device, the method comprising:

providing a substrate; forming a first plurality of layers comprising a semiconductor material on top of the substrate, wherein a first, lower distributed Bragg reflector (DBR) is formed in the first plurality of layers, and wherein at least one of the first plurality of layers is of a first type of semiconductor material;

forming at least a first intrinsic layer containing a light-emitting material on top of the first plurality of layers, said at least a first intrinsic layer being an active region of the semiconductor device;

forming a second plurality of layers comprising a semiconductor material on top of said at least a first intrinsic layer, wherein a second, upper DBR is formed in the second plurality of layers, and wherein at least one layer of the second plurality of layers is of a second type of semiconductor material that is different from the first type, and wherein portions of said at least a first plurality of layers, the first intrinsic layer, and the second plurality of layers constitute a vertical cavity surface emitting laser (VCSEL);

forming at least a second intrinsic layer on top of the upper DBR; and forming at least one layer of said first type of semiconductor material on top of said at least a second intrinsic layer, and wherein portions of the upper DBR, said at least a second intrinsic layer, and said at least one layer of said first type of semiconductor material constitute a protection diode for protecting the VCSEL from electrostatic discharge (ESD) events.

16. The method of claim 15, wherein said portion of said at least a second intrinsic layer has a depletion region that has a width that is equal to or greater than 100 nanometers (nm).

17. The method of claim 16, wherein said portion of said at least a second intrinsic layer has a depletion region that has a width that is equal to or greater than 400 nm.

18. The method of claim 15, further comprising:

forming ohmic p and n contact pads on the VCSEL and on the protection diode;

forming a first metal interconnect that interconnects the p contact pad formed on the VCSEL with the n contact pad formed on the protection diode;

forming a second metal interconnect that interconnects the n contact pad formed on the VCSEL with the p contact pad formed on the protection diode; and forming one or more layers of dielectric material on the semiconductor device to electrically isolate the p and n contact pads from each other, and wherein the second intrinsic layer reduces a capacitance of the protection diode to allow the VCSEL to operate at high speeds.

19. The method of claim 15, wherein the first type of semiconductor material is n-type semiconductor material, and wherein all of the layers of the first plurality of layers are made of n-type semiconductor material.

20. The method of claim 19, wherein the second type of semiconductor material is p-type semiconductor material, and wherein all of the layers of the second plurality of layers are made of p-type semiconductor material.

21. The method of claim 15, wherein the first type of semiconductor material is p-type semiconductor material, and wherein all of the layers of the first plurality of layers are made of p-type semiconductor material.

22. The method of claim 21, wherein the second type of semiconductor material is n-type semiconductor material, and wherein all of the layers of the second plurality of layers are made of n-type semiconductor material.

* * * * *